: US 11,335,881 B2
(45) Date of Patent: May 17, 2022

(12) United States Patent
Wang

(54) DISPLAY PANEL

(71) Applicant: WUHAN CHINA STAR OPTOELECTRONICS SEMICONDUCTOR DISPLAY TECHNOLOGY CO., LTD., Wuhan (CN)

(72) Inventor: Kun Wang, Wuhan (CN)

(73) Assignee: WUHAN CHINA STAR OPTOELECTRONICS SEMICONDUCTOR DISPLAY TECHNOLOGY CO., LTD., Wuhan (CN)

(*) Notice: Subject to any disclaimer, the term of this patent is extended or adjusted under 35 U.S.C. 154(b) by 204 days.

(21) Appl. No.: 16/624,126

(22) PCT Filed: Sep. 24, 2019

(86) PCT No.: PCT/CN2019/107473
§ 371 (c)(1),
(2) Date: Dec. 18, 2019

(87) PCT Pub. No.: WO2020/258550
PCT Pub. Date: Dec. 30, 2020

(65) Prior Publication Data
US 2021/0343984 A1 Nov. 4, 2021

(30) Foreign Application Priority Data
Jun. 26, 2019 (CN) .......................... 201910560636.4

(51) Int. Cl.
H01L 51/52 (2006.01)

(52) U.S. Cl.
CPC ................................ H01L 51/5253 (2013.01)

(58) Field of Classification Search
CPC .................. H01L 51/5253–5256; H01L 51/56
See application file for complete search history.

(56) References Cited

U.S. PATENT DOCUMENTS 10,541,380 B1* 1/2020 Sung ................... H01L 51/0097
11,088,345 B2* 8/2021 Zhao ................... H01L 27/3246
(Continued)

FOREIGN PATENT DOCUMENTS

CN          106876428 A       6/2017
CN          107275363 A       10/2017
(Continued)

Primary Examiner — Shaun M Campbell
(74) Attorney, Agent, or Firm — Osha Bergman Watanabe & Burton LLP

(57) ABSTRACT

A display panel is provided. A side surface of an interlayer insulating layer away from the substrate is partially recessed to a substrate so as to form a first groove. A crack preventing member is filled in the first groove and is connected to the substrate, so a connection of the organic layer to the organic layer is achieved, thereby increasing a bending resistance of the display panel and reducing the risk of film peeling. In addition, a side surface of the interlayer insulating layer disposed between the first groove and the banks away from the substrate is partially recessed to form a second groove, and the first inorganic packaging layer is filled in the second groove. An inorganic layer of the packaging layer is connected to an inorganic layer of an array substrate, thereby increasing a bending resistance of the display panel and reducing the risk of film peeling.

6 Claims, 1 Drawing Sheet

(56) References Cited

U.S. PATENT DOCUMENTS

| | | | |
|---|---|---|---|
| 2016/0204373 A1* | 7/2016 | Park | H01L 27/3246 257/40 |
| 2017/0288004 A1 | 10/2017 | Kim et al. | |
| 2018/0061910 A1* | 3/2018 | Cai | H01L 27/3223 |
| 2018/0159074 A1* | 6/2018 | Kim | H01L 51/5253 |
| 2018/0286938 A1* | 10/2018 | Moon | H01L 27/1218 |
| 2020/0006700 A1* | 1/2020 | Kim | H01L 27/3258 |
| 2020/0052051 A1* | 2/2020 | Lee | H01L 27/3246 |
| 2020/0067017 A1* | 2/2020 | Seo | H01L 51/5256 |
| 2020/0075700 A1* | 3/2020 | Cao | H01L 51/56 |
| 2020/0105168 A1* | 4/2020 | Choi | H01L 51/5253 |
| 2020/0119304 A1* | 4/2020 | Choi | H01L 51/52 |
| 2020/0127216 A1* | 4/2020 | Tao | H01L 51/5256 |
| 2020/0185423 A1* | 6/2020 | Hu | H01L 27/127 |
| 2020/0310493 A1* | 10/2020 | Kim | G06F 1/1609 |
| 2020/0395562 A1* | 12/2020 | Minami | G09G 3/3283 |
| 2020/0395573 A1* | 12/2020 | Zhang | H01L 27/3246 |

FOREIGN PATENT DOCUMENTS

| | | | |
|---|---|---|---|
| CN | 109004104 A | 12/2018 | |
| CN | 109449306 A | 3/2019 | |
| CN | 109461832 A | 3/2019 | |

* cited by examiner

DISPLAY PANEL

BACKGROUND OF INVENTION

Field of Invention

The present invention relates to the field of display technology, and more particularly, to a display panel.

Description of Prior Art

Organic light emitting diode (OLED) devices are also known as organic electroluminescence display devices, organic light emitting semiconductors. The basic structure of an OLED device includes a thin transparent layer made of indium tin oxide (ITO), which has semiconductor characteristics and is connected to an anode, and a metal cathode, and they are packaged to from a sandwich structure. The entire structural layer includes a hole transport layer (HTL), a light emitting layer (EL), and an electron transport layer (ETL). When an appropriate voltage is applied, holes supplied by the anode and electrons supplied by the cathode are combined in the light emitting layer. Under action of Coulomb force, holes and electrons are combined at a certain probability to form excitons, which are electron-hole pairs, in an excited state. The excited state is unstable under normal conditions. The excitons in the excited state are recombined and transfer energy to luminescent materials, causing the luminescent materials to transition from the ground state level to the excited state. The excited state energy generates photons through the radiation relaxation process and releases light, thereby emitting light and generating three primary colors of red, green, and blue (RGB) to form the basic color based on different formulas.

First, the OLED devices are self-luminous, which are different from thin film transistor liquid crystal display (TFT-LCD) devices having a backlight module. Thus, the OLED devices have high visibility and brightness. Secondly, OLED devices have the advantages of low voltage, high energy saving efficiency, fast response times, light weight, thin thickness, simple structure, low cost, wide viewing angles, almost infinite contrast, low power consumption, and high response speed. The OLED devices are become one of the most important display technologies, and are gradually replacing TFT-LCD and expected to become the next generation mainstream display technology after liquid crystal display (LCD) devices.

However, the OLED devices are particularly sensitive to moisture. Metal electrodes and organic light emitting materials are highly susceptible to be deteriorated from moisture. In order to prevent damage to the devices, it is necessary to package the metal electrodes and the luminescent materials so as to protect the devices. The traditional packaging method is rigid package, but the devices may not be bent after using the rigid package. In order to achieve the purpose of flexible display, a thin film encapsulation (TFE) method is adopted, that is, a multi-layer inorganic/organic layer overlapping method, in which an inorganic layer is used to block moisture and an organic layer is used to release stress during a bending process and encapsulate particles, etc.

Currently, the development trend of OLED display panels is to enhance the bending performance of the panel to adapt to various dynamic bending and static bending products. However, an edge peeling of the OLED display panels is occurred at high temperature and high humidity test after a thin film encapsulating process, which seriously affects the normal life of the display panels. Therefore, it needs to find a new type of display panel to solve the above problems.

SUMMARY OF INVENTION

An object of the present invention is to provide a display panel to solve the problem of film peeling caused by the weak bonding force between the packaging layer and the underlying array substrate in the conventional display panel, thereby avoiding the failure of the display panel.

A display panel includes a substrate, a buffer layer, an insulating layer, an interlayer insulating layer, a crack preventing member, banks, a first inorganic packaging layer, a second inorganic packaging layer, and an organic layer. The buffer layer is disposed on the substrate. The insulating layer is disposed on the buffer layer. The interlayer insulating layer is disposed on the insulating layer, and a side surface of the interlayer insulating layer away from the substrate is partially recessed to form a first groove. The crack preventing member is filled in the first groove and covers the interlayer insulating layer. The banks are spaced apart from each other on the interlayer insulating layer between two first grooves. The first inorganic packaging layer covers the interlayer insulating layer. The second inorganic packaging layer covers the first inorganic packaging layer. The organic layer covers the second inorganic packaging layer.

In one embodiment, a side surface of the interlayer insulating layer disposed between the first groove and the banks away from the substrate is partially recessed to form a second groove, and the first inorganic packaging layer is filled in the second groove and covers the interlayer insulating layer.

In one embodiment, a side of the first inorganic packaging layer away from the substrate is partially recessed to form a third groove, and the second inorganic packaging layer is filled in the third groove and covers the first inorganic packaging layer.

In one embodiment, the first groove is recessed to penetrate through the insulating layer and the buffer layer up to the substrate.

In one embodiment, the first groove comprises a plurality of first sub-grooves spaced apart from each other, a distance between the first sub-grooves ranges from 1 to 10 μm, and a width of the first sub-groove ranges from 1 to 1-10 μm.

In one embodiment, a depth of the first sub-groove is less than the width of the first sub-groove.

In one embodiment, a bottom of the second groove is disposed on a side surface of the buffer layer facing the substrate.

In one embodiment, the second groove comprises a plurality of second sub-grooves spaced apart from each other, a distance between the second sub-grooves ranges from 1 to 20 μm, and a width of the second sub-groove ranges from 1 to 1-20 μm.

In one embodiment, a depth of the second sub-groove is less than the width of the second sub-groove.

In one embodiment, the crack preventing member is connected to the bank, and a side surface of the crack preventing member away from the substrate is partially recessed to form the second groove.

A display panel is provided. A side surface of an interlayer insulating layer away from the substrate is partially recessed to a substrate so as to form a first groove. A crack preventing member is filled in the first groove and is connected to the substrate, so a connection of the organic layer to the organic layer is achieved, thereby increasing a bending resistance of the display panel and reducing the risk of film peeling. In addition, a side surface of the interlayer insulating layer disposed between the first groove and the banks away from the substrate is partially recessed to form a second groove, and the first inorganic packaging layer is filled in the second groove. An inorganic layer of the packaging layer is connected to an inorganic layer of an array substrate, thereby increasing a bending resistance of the display panel and reducing the risk of film peeling.

BRIEF DESCRIPTION OF DRAWINGS

In order to more clearly illustrate the technical solutions in the embodiments, the drawings described in the description of the embodiments are briefly described below. It is obvious that the drawings in the following description are only some embodiments of the present invention. Other drawings can also be obtained from those skilled persons in the art based on drawings without any creative effort.

Figure 1:
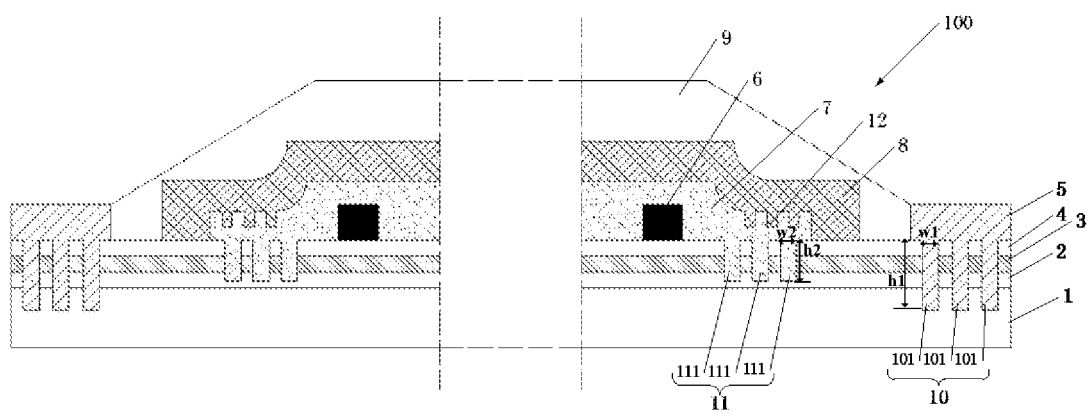
FIG. 1 is a schematic view of a display panel according to first embodiment 1 of the present invention.

Reference numerals are described below:
display panel 100; the substrate 1; buffer layer 2; insulating layer 3; interlayer insulating layer 4; crack preventing member 5; bank 6; first inorganic packaging layer 7; second inorganic packaging layer 8; organic layer 9; first groove 10; second groove 11; third groove 12; first sub-grooves 101; and second sub-grooves 111.

DETAILED DESCRIPTION OF PREFERRED EMBODIMENTS

The preferred embodiments of the present invention are described in detail below with reference to the accompanying drawings. Those skilled persons in the art will easily understand how to implement the invention. The invention can be implemented by the embodiments, so that the technical content of the disclosure will be clear, so that those skilled persons in the art will understand how to implement the invention. The present invention may be accomplished in many different embodiments, and the scope of the invention is not limited to the embodiments described herein.

Directional terms mentioned in this application, such as "up," "down," "forward," "backward," "left," "right," "inside," "outside," "side," etc., are merely indicated the direction of the drawings. Therefore, the directional terms are used for illustrating and understanding of the application rather than limiting thereof.

In the drawings, identical components are marked with the same reference numerals, and structural or components having similar functions are marked with similar reference numerals. Moreover, the size and thickness of each component shown in the drawings are arbitrarily shown for understanding and describing, and the invention does not limit the size and thickness of each component.

When a component is described as "on" another component, the component can be disposed directly on the other component. Also, one component is disposed on an intermediate component, and the intermediate component is disposed on another component. When a component is described as "installed" or "connected" to another component, it can be understood as directly "installed" or "connected" to another component.

First Embodiment

Referring to FIG. 1, a display panel 100 includes a substrate 1, a buffer layer 2, an insulating layer 3, an interlayer insulating layer 4, a crack preventing member 5, a bank 6, a first inorganic packaging layer 7, a second inorganic packaging layer 8, and an organic layer 9.

The buffer layer 2 is disposed on the substrate. The insulating layer 3 is disposed on the buffer layer 2. The interlayer insulating layer 4 is disposed on the insulating layer 3.

Referring to FIG. 1, a side surface of the interlayer insulating layer 4 away from the substrate 1 is partially recessed to form a first groove 11. The crack preventing member 5 is filled in the first groove 11 and covers the interlayer insulating layer 4. The crack preventing member 5 is formed by inkjet printing or coating organic compound, and the crack preventing member 5 is overlapped with the substrate 1 by the first groove 11, thereby increasing the bending resistance of the display panel and reducing the risk of film peeling.

The first groove 10 is recessed to penetrate through the insulating layer 3 and the buffer layer 2 up to the substrate 7. Since the substrate 1 is generally made of organic compound, the overlapping of the organic compound between the crack preventing member 5 and the substrate can be achieved, thereby reducing the risk of film peeling.

Referring to FIG. 1, the first groove 10 includes a plurality of first sub-grooves 101 spaced apart from each other, a distance between the first sub-grooves 101 ranges from 1 to 10 μm, a width w1 of the first sub-groove 101 ranges from 1 to 1-10 μm, and a depth h1 of the first sub-groove is less than the width w1 of the first sub-groove. Specifically, a number of first sub-grooves 101 can be determined according to actual conditions.

Referring to FIG. 1, the banks 6 are spaced apart from each other on the interlayer insulating layer 4 between two first grooves 10. A side surface of the interlayer insulating layer 4 disposed between the first groove 10 and the banks 6 away from the substrate is partially recessed to form a second groove 11, and the first inorganic packaging layer 7 is filled in the second groove 11 and covers the interlayer insulating layer 4. Therefore, the first inorganic packaging layer 7 is overlapped with the inorganic layer of the array substrate, and the bonding force between the packaging layer and the array substrate is increased, thereby increasing the bending resistance of the display panel and reducing the risk of film peeling.

Referring to FIG. 1, a bottom of the second groove 11 is disposed on a side surface of the buffer layer 2 facing the substrate 1. In other words, the second groove 11 cannot exceed the buffer layer 2 because buffer layer 2 is disposed on the substrate 1 and the substrate 1 is an organic layer. Thus, the connection of the inorganic layer and the inorganic layer cannot be achieved.

Referring to FIG. 1, the second groove 11 includes a plurality of second sub-grooves 111 spaced apart from each other, a distance between the second sub-grooves 111 ranges from 1 to 20 μm, and a width w2 of the second sub-groove 111 ranges from 1 to 1-20 μm. A depth h2 of the second sub-groove 111 is less than the width w2 of the second sub-groove 111. Specifically, a number of second sub-grooves 111 can be determined according to actual conditions.

Referring to FIG. 1, the second inorganic packaging layer 8 covers the first inorganic packaging layer 7. The organic layer 9 covers the second inorganic packaging layer 8. In one embodiment, a side of the first inorganic packaging layer 7 away from the substrate 1 is partially recessed to form a third groove 12, and the second inorganic packaging layer 8 is filled in the third groove 12 and covers the first inorganic packaging layer 7. Therefore, the bonding force between the first inorganic packaging layer 7 and the second inorganic packaging layer 8 is increased, thereby increasing the bending resistance of the display panel and reducing the risk of film peeling.

The first inorganic packaging layer 7 and the second inorganic packaging layer 8 may be formed by any one of atomic layer deposition, pulsed laser deposition, magnetron sputtering, and plasma chemical vapor deposition.

The constituent materials of the first inorganic packaging layer 7 and the second inorganic packaging layer 8 include one or more of SiNx, SiOxNy, SiOx, SiCxNy, ZnO, and AlOx. Thus, the first inorganic packaging layer 7 and the second inorganic packaging layer 8 have a better moisture blocking property.

Second Embodiment

Figure 2:
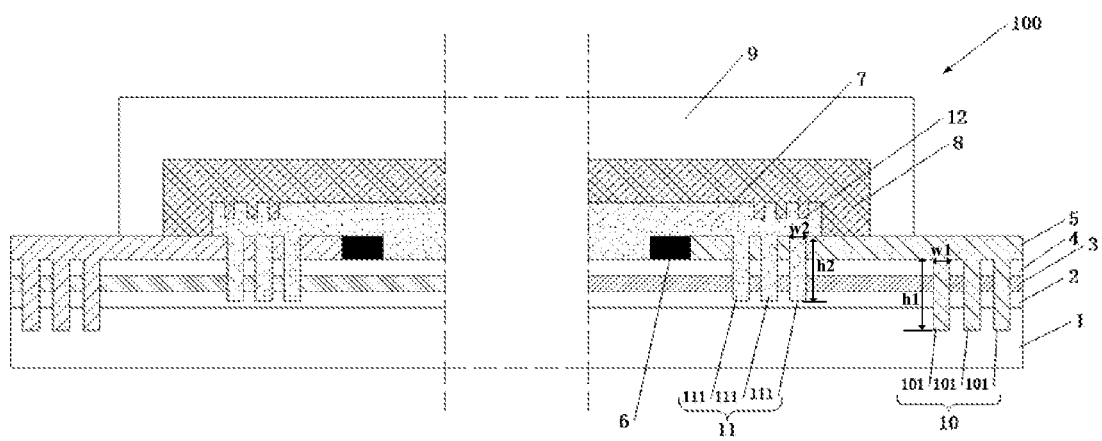
FIG. 2 is a schematic view of a display panel according to second embodiment 2 of the present invention.

Referring to FIG. 2, the difference between the second embodiment and the first embodiment is that the crack preventing member 5 is connected to the bank 6, and a side surface of the crack preventing member 5 away from the substrate 1 is partially recessed to form the second groove 11. Therefore, the first inorganic packaging layer 7 is overlapped with the inorganic layer of the array substrate, and the bonding force between the packaging layer and the array substrate is increased, thereby increasing the bending resistance of the display panel and reducing the risk of film peeling.

The display panel has been described in detail above. It should be understood that the exemplary embodiments described herein are to be considered as illustrative only, and are not intended to limit the invention. Descriptions of features or aspects in each exemplary embodiment should generally be considered as suitable features or aspects in other exemplary embodiments. While the invention has been described with reference to the preferred embodiments thereof, various modifications, and changes can be made by those skilled persons in the art. The present invention is intended to cover such modifications and variations within the scope of the appended claims, and any modifications, equivalents, and modifications within the spirit and scope of the present invention are intended to be included within the scope of the present invention.

What is claimed is:

1. A display panel, comprising:
a substrate;
a buffer layer, wherein the buffer layer is disposed on the substrate;
an insulating layer, wherein the insulating layer is disposed on the buffer layer;
an interlayer insulating layer, wherein the interlayer insulating layer is disposed on the insulating layer, and a side surface of the interlayer insulating layer away from the substrate is partially recessed to form a first groove;
a crack preventing member, wherein the crack preventing member is filled in the first groove and covers the interlayer insulating layer;
banks, wherein the banks are spaced apart from each other on the interlayer insulating layer between two first grooves, and projections of the banks and the first groove on the substrate in a direction perpendicular to the substrate are spaced apart from each other;
a first inorganic packaging layer, wherein the first inorganic packaging layer covers the interlayer insulating layer;
a second inorganic packaging layer, wherein the second inorganic packaging layer covers the first inorganic packaging layer; and
an organic layer, wherein the organic layer covers the second inorganic packaging layer,
wherein a side surface of the interlayer insulating layer disposed between the first groove and the banks away from the substrate is partially recessed to form a second groove, and the first inorganic packaging layer is filled in the second groove and covers the interlayer insulating layer, and
wherein the crack preventing member is connected to a corresponding bank of the banks, and a side surface of the crack preventing member away from the substrate is partially recessed to form the second groove.

2. The display panel according to claim 1, wherein a side of the first inorganic packaging layer away from the substrate is partially recessed to form a third groove, and the second inorganic packaging layer is filled in the third groove and covers the first inorganic packaging layer.

3. The display panel according to claim 1, wherein the first groove is recessed to penetrate through the insulating layer and the buffer layer up to the substrate.

4. The display panel according to claim 1, wherein the first groove comprises a plurality of first sub-grooves spaced apart from each other, a distance between the first sub-grooves ranges from 1 to 10 µm, and a width of the first sub-groove ranges from 1 to 10 µm.

5. The display panel according to claim 1, wherein a bottom of the second groove is disposed on a side surface of the buffer layer facing the substrate.

6. The display panel according to claim 1, wherein the second groove comprises a plurality of second sub-grooves spaced apart from each other, a distance between the second sub-grooves ranges from 1 to 20 µm, and a width of the second sub-groove ranges from 1 to 20 µm.

* * * * *